(12) United States Patent
Coursey (10) Patent No.: US 6,287,935 B1
(45) Date of Patent: Sep. 11, 2001

(54) SEMICONDUCTOR PROCESSING METHODS OF FORMING HEMISPHERICAL GRAIN POLYSILICON LAYERS, METHODS OF FORMING CAPACITORS, AND CAPACITORS

(75) Inventor: Belford T. Coursey, Meridian, ID (US)

(73) Assignee: Micron Technology, Inc., Boise Id ( * ) Notice: Subject to any disclaimer, the term of this patent is extended or adjusted under 35 U.S.C. 154(b) by 0 days.

(21) Appl. No.: 09/632,233

(22) Filed: Aug. 4, 2000

Related U.S. Application Data

(63) Continuation of application No. 09/493,040, filed on Jan. 27, 2000, now Pat. No. 6,121,084.

(51) Int. Cl.[7] .................................................. H01L 21/336
(52) U.S. Cl. .......................... 438/398; 438/396; 438/260; 438/255; 438/239; 257/309; 257/296; 257/308
(58) Field of Search ................................. 438/239, 255, 438/260, 398, 396; 257/309, 296, 308

(56) References Cited

U.S. PATENT DOCUMENTS

| 5,831,282 | 11/1998 | Nuttall ..................................... 257/64 |
|---|---|---|
| 5,840,606 | 11/1998 | Lee ........................................ 438/255 |
| 5,877,061 | 3/1999 | Halle et al. ............................ 438/386 |
| 5,930,641 | 7/1999 | Pan ........................................ 438/398 |
| 6,025,225 | 2/2000 | Forbes et al. ......................... 438/243 |
| 6,046,083 | 4/2000 | Lin et al. .............................. 438/255 |
| 6,066,529 | 5/2000 | Lin et al. .............................. 438/255 |
| 6,124,607 | * 9/2000 | Sandhu et al. ....................... 257/309 |
| 6,181,485 | * 1/2001 | Parekh et al. ........................ 438/398 |
| 6,190,992 | * 2/2001 | Sandhu et al. ....................... 438/398 |
| 6,207,523 | * 3/2001 | Rarekh et al. ....................... 438/396 |

* cited by examiner

Primary Examiner—Matthew Smith
Assistant Examiner—V. Yevsikov
(74) Attorney, Agent, or Firm—Wells, St. John, Roberts, Gregory & Matkin, P.S.

(57) ABSTRACT

In one aspect of the invention, an amorphous layer of silicon is provided which has a gradient of thickness variation. The amorphous layer of silicon is transformed into a hemispherical grain polysilicon layer that has varying grain size therein. In another aspect of the invention, a material is provided and has an upper surface and inwardly tapered openings. A first electrically conductive electrode layer is formed within the openings and includes a plurality of hemispherical grain polysilicon layers. At least one of the hemispherical grain polysilicon layers has a grain size gradient defined by a smaller grain size in a region proximate the upper surface and a larger grain size beneath the region with the smaller grain size. An electrically insulative layer is formed over the first electrode layer and a second electrically conductive electrode layer is formed over the electrically insulative layer.

16 Claims, 7 Drawing Sheets

_Fig 1_
_PRIOR ART_

_Fig 2_

SEMICONDUCTOR PROCESSING METHODS OF FORMING HEMISPHERICAL GRAIN POLYSILICON LAYERS, METHODS OF FORMING CAPACITORS, AND CAPACITORS

RELATED PATENT DATA

This patent resulted from a continuation application of U.S. patent application Ser. No. 09/493,040, filed Jan. 27, 2000 now U.S. Pat. No. 6,121,084, entitled "Semiconductor Processing Methods of Forming Hemispherical Grain Polysilicon Layers, Methods of Forming Capacitors, and Capacitors", naming Belford T. Coursey as inventor.

TECHNICAL FIELD

This invention relates to semiconductor processing methods of forming hemispherical grain polysilicon layers, methods of forming capacitors, and capacitors.

BACKGROUND OF THE INVENTION

As integration density of semiconductor memory devices increases, the separation between adjacent memory cells decreases. Such decrease in separation can cause shorting between adjacent devices.

Figure 1:
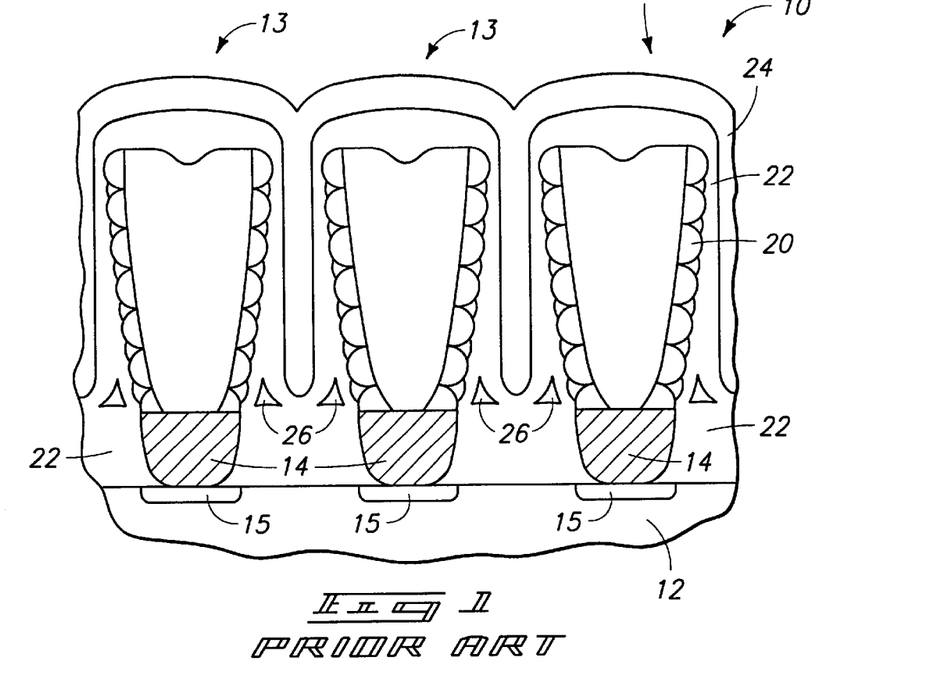
FIG. 1 is a fragmentary sectional view of a prior art semiconductor substrate.

FIG. 1 illustrates exemplary problems. A semiconductor wafer fragment 10 comprises a bulk substrate 12 having diffusion regions 15 formed therein. Diffusion regions 15 can be part of transistor constructions. Conductive plugs 14 are electrically connected to regions 15 and extend to capacitor constructions 13.

Capacitor constructions 13 comprise a storage node 20, which in the shown example is a hemispherical grain polysilicon (HSG) layer. A dielectric layer 22 is provided over the HSG layer 20 and a conductive layer 24 is formed over dielectric layer 22. Conductive layer 24 defines a capacitor plate for capacitor constructions 13.

Close spacing of adjacent capacitor constructions 13 can inhibit conformal forming of layers 22 and 24, and lead to voids 26 being formed between adjacent capacitor constructions 13. Such voids 26 can undesirably alter dielectric properties at various regions of capacitor constructions 13 relative to other regions of the capacitor constructions 13.

Another problem that can be caused by the close spacing of capacitor constructions 13 is short circuiting between adjacent devices.

Either of the above-discussed problems can detrimentally affect the performance of the memory cells. Accordingly, it is desired to develop new methods of forming conductive devices, and in particular, it is desired to develop new methods of forming capacitor constructions.

SUMMARY OF THE INVENTION

In one aspect of the invention, an amorphous layer of silicon is provided which has a gradient of thickness variation. The amorphous layer of silicon is transformed into a hemispherical grain polysilicon layer that has varying grain size therein.

In another aspect of the invention, an opening is formed in a material and the opening has inwardly sloped walls. A plurality of hemispherical grain polysilicon layers are formed within the opening and the hemispherical grain polysilicon layers extend from a lower portion of the opening to an upper portion. At least one hemispherical grain polysilicon layer has a grain size which increases at the lower portion of the opening relative to a grain size of the hemispherical grain polysilicon layer at the upper portion of the opening.

In still another aspect of the invention, a material is provided and has an upper surface and inwardly tapered openings. A first electrically conductive electrode layer is formed within the openings and the first electrode layer includes hemispherical grain polysilicon. The first electrode layer has terminal ends that form an upper surface proximate the upper surface of the material. The hemispherical grain polysilicon has a grain size gradient defined by a smaller grain size at the terminal ends and a larger grain size beneath the upper surface. An electrically insulative layer is formed over the first electrode layer and a second electrically conductive electrode layer is formed over the electrically insulative layer.

In yet another aspect of the invention, a material with an opening therein has a first electrically conductive electrode layer of hemispherical grain polysilicon within the opening. The hemispherical grain polysilicon has a portion proximate an upper surface of the material. The hemispherical grain polysilicon has a grain size gradient defined by a smaller grain size at the portion proximate the upper surface and a larger grain size at another portion below the portion proximate the upper surface. An electrically insulative layer extends over the first electrode layer and a second electrically conductive electrode layer extends over the electrically insulative layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

To aid in interpretation of the claims that follow, the terms "semiconductive substrate" and "semiconductor substrate" are defined to mean any construction comprising semiconductive material including, but not limited to, bulk semiconductor materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 2:
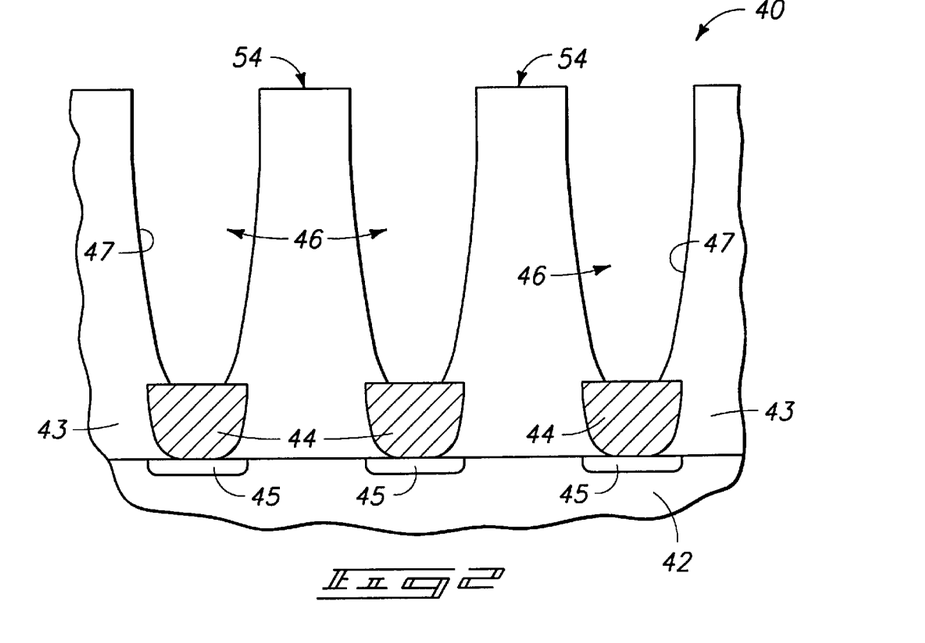
FIG. 2 is a fragmentary sectional view of a semiconductor substrate at one processing step in accordance with a first embodiment of the invention.

With reference to FIGS. 2–13, exemplary embodiments of the present invention are illustrated. Referring to FIG. 2, a semiconductive substrate fragment in process is indicated generally by reference 40. Such comprises a bulk substrate region 42, having diffusion regions 45 therein. Conductive pillars, or plugs, 44 are formed in electrical communication with diffusion regions 45. Diffusion regions 45 can be, for example, source/drain regions of a transistor. An insulative material 43 (which can comprise, for example, borophosphosilicate glass (BPSG)) is provided over substrate 42.

A plurality of openings 46 are formed within material 43, and material 43 forms a first upper surface 54. Exemplary spacing between the openings 46 comprises a distance of from about 800 Angstroms to about 1,000 Angstroms. Openings 46 extend to conductive plugs 44. The shown plugs 44 can be eliminated in other embodiments (not shown), and openings 46 could extend entirely to diffusion regions 45. Openings 46 have a width which tapers from a first dimension to a second dimension such that the second dimension is smaller than the first dimension. For example, as openings 46 extend into material 43 from first upper surface 54, walls 47 of the openings 46 slope or converge inwardly to form tapered walls 47. An exemplary method of forming openings 46 is by exposing material 43 to etching conditions. The sloped or tapered walls 47 are a common result of forming openings 46 because the upper surface 54 is exposed to the etching conditions for a longer duration of time than portions of material 43 elevationally below the upper surface 54.

Figure 3:
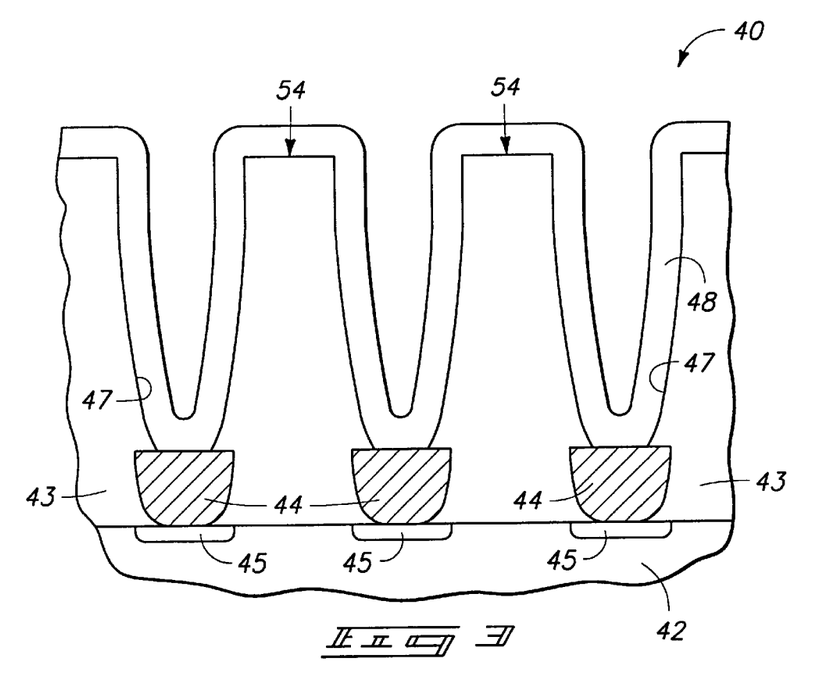
FIG. 3 is a view of the FIG. 2 substrate fragment shown at a processing step subsequent to that of FIG. 2.

Referring to FIG. 3, a layer 48 of amorphous silicon is formed along the tapered walls 47 of openings 46 and over the first upper surface 54. An exemplary layer 48 has a thickness of from about 250 Angstroms to about 800 Angstroms. In one aspect of the invention, the layer 48 of amorphous silicon comprises an undoped. layer that is about 500 Angstroms thick. In another aspect of the invention, layer 48 of amorphous silicon can be processed to vary its thickness thereby improving or optimizing the design of a capacitor construction, i.e., by varying the size, pitch, and/or taper of a capacitor component.

Figure 4:
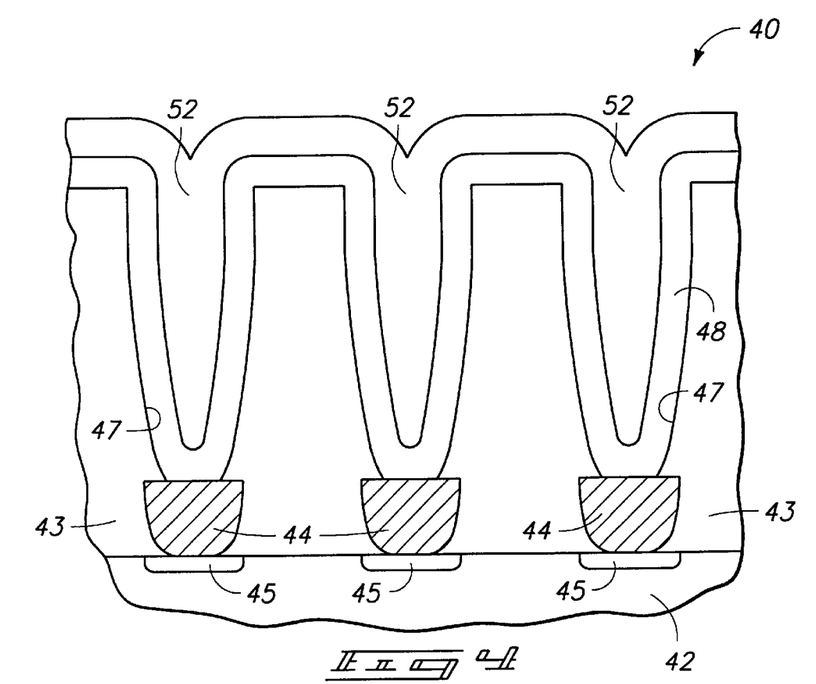
FIG. 4 is a view of the FIG. 2 substrate fragment shown at a processing step subsequent to that of FIG. 3.

Referring to FIG. 4, a layer 52 of doped polycrystalline silicon (polysilicon) is formed over layer 48 of amorphous silicon. Doped polysilicon layer 52 is provided to a thickness which fills openings 46.

Figure 5:
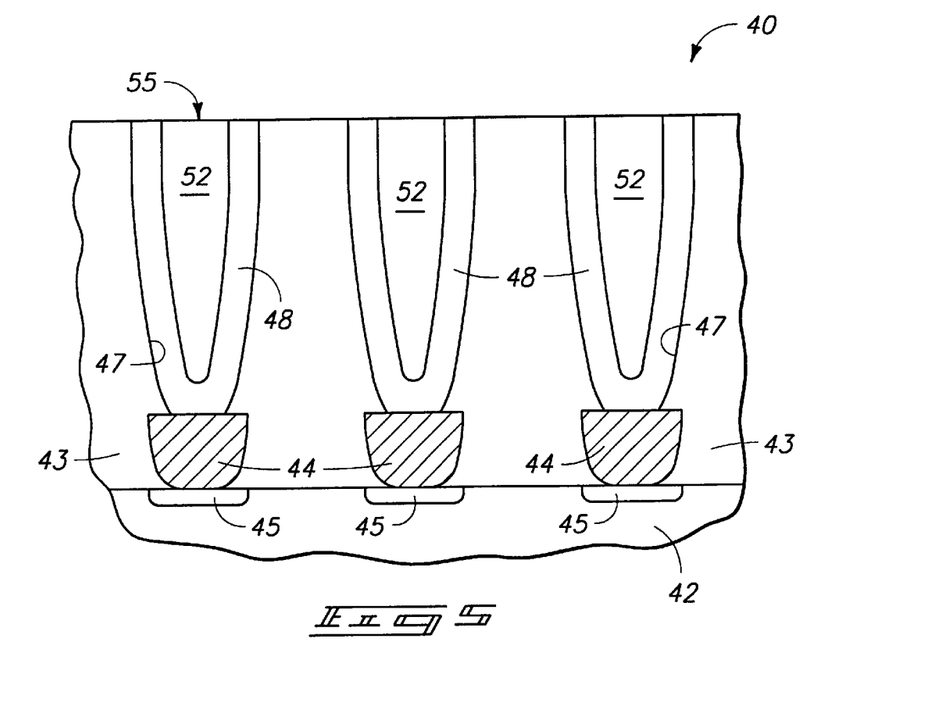
FIG. 5 is a view of the FIG. 2 substrate fragment shown at a processing step subsequent to that of FIG. 4.

Referring to FIG. 5, portions of doped polysilicon layer 52 and amorphous silicon layer 48 are removed to form a second upper surface 55. An exemplary process to form the second upper surface 55 comprises a chemical-mechanical polishing (CMP) process to etch back amorphous silicon layer 48 and doped polysilicon layer 52. In one aspect of the invention, layer 48 and layer 52 are etched back to surface 54 (FIG. 4).

Figure 6:
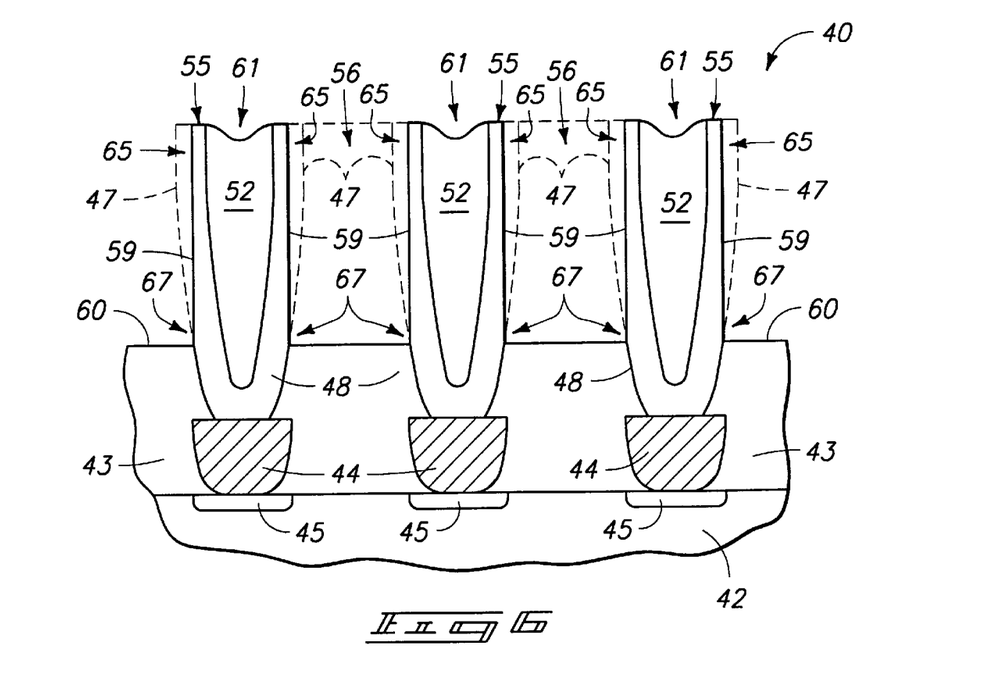
FIG. 6 is a view of the FIG. 2 substrate fragment shown at a processing step subsequent to that of FIG. 5.

Referring to FIG. 6, second upper surface 55 is exposed to etching conditions such that amorphous silicon layer 48 is etched selectively relative to BPSG material 43. The etching conditions comprise, for example, a buffered oxide etch which etches amorphous silicon layer 48 at a slower rate than BPSG material 43. A suitable etch utilizes a solution comprising hydrofluoric acid (HF) (assay of 49 percent) diluted (buffered) with ammonium fluoride (NH$_4$F) and comprises exposure to such solution at 21° C. for approximately 25 minutes. Such etching conditions can etch amorphous silicon layer 48 at a removal rate of about 11 Angstroms per minute, and can etch BPSG material 43 at a removal rate of about 280 Angstroms per minute.

The etching of material 43 forms recesses 56 therein and a third upper surface 60 elevationally below second upper surface 55. In one aspect of the invention, only a portion of BPSG substrate 43 is removed to leave room beneath the third upper surface 60 for word lines, digit lines, or other circuit components (not shown) which may have been formed by previous processing. The tapered walls 47 (shown in phantom) etch back to form a wall 59 of amorphous silicon layer 48, with wall 59 being more vertical than previous wall 47. The etched amorphous silicon layer 48 has a gradient of thickness, and specifically is thinner at a first region 65 proximate upper surface 55 than at a second region 67 below the first region 65. An exemplary gradient progression would continuously increase between the smaller thickness and larger thickness. The shown etching conditions also remove a small portion of doped polysilicon layer 52 to form shallow divots 61.

Figure 7:
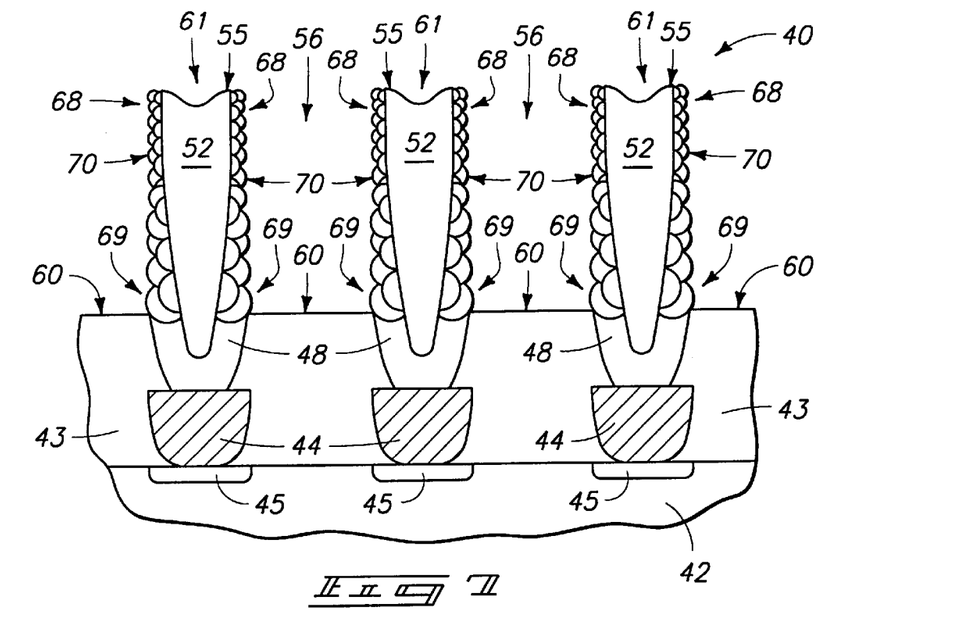
FIG. 7 is a view of the FIG. 2 substrate fragment shown at a processing step subsequent to that of FIG. 6.

Referring to FIG. 7, amorphous silicon layer 48 is converted into a hemispherical grain polysilicon (HSG) layer 70. Such conversion can be accomplished, for example, by placing substrate 42 in a low pressure chamber to subject substrate 42 to a thermal process under conditions to seed amorphous silicon layer 48 with disilane and then subject the same to annealing temperatures. Exemplary thermal processing includes conventional thermal processing and rapid thermal processing (RTP). Next, doped polysilicon layer 52 is subjected to conditions to out-diffuse dopant from doped polysilicon layer 52 into HSG layer 70. Exemplary dopant sources for polysilicon layer 52 are phosphine (PH$_3$) and arsine (AsH$_3$). The grain size of the HSG layer 70 varies from a smaller grain size at a first region 68 proximate upper surface 55, to a larger grain size at a second region 69 below the first region 68. An exemplary gradient progression would continually increase between the smaller grain size to the larger grain size.

In one aspect of the invention, the HSG layer 70 comprises a capacitor storage node. Portions of HSG layers 70 represented by first regions 68 are spaced a greater distance from adjacent first regions 68 of HSG layers 70 than if the etch of FIG. 6 had not been performed. Accordingly, potential for short circuiting between the nodes is reduced. Additionally, the larger grain size in second regions 69 maximizes surface area of the capacitor storage nodes to increase the storage capacity of the node where short circuiting may not be such a problem.

Figure 8:
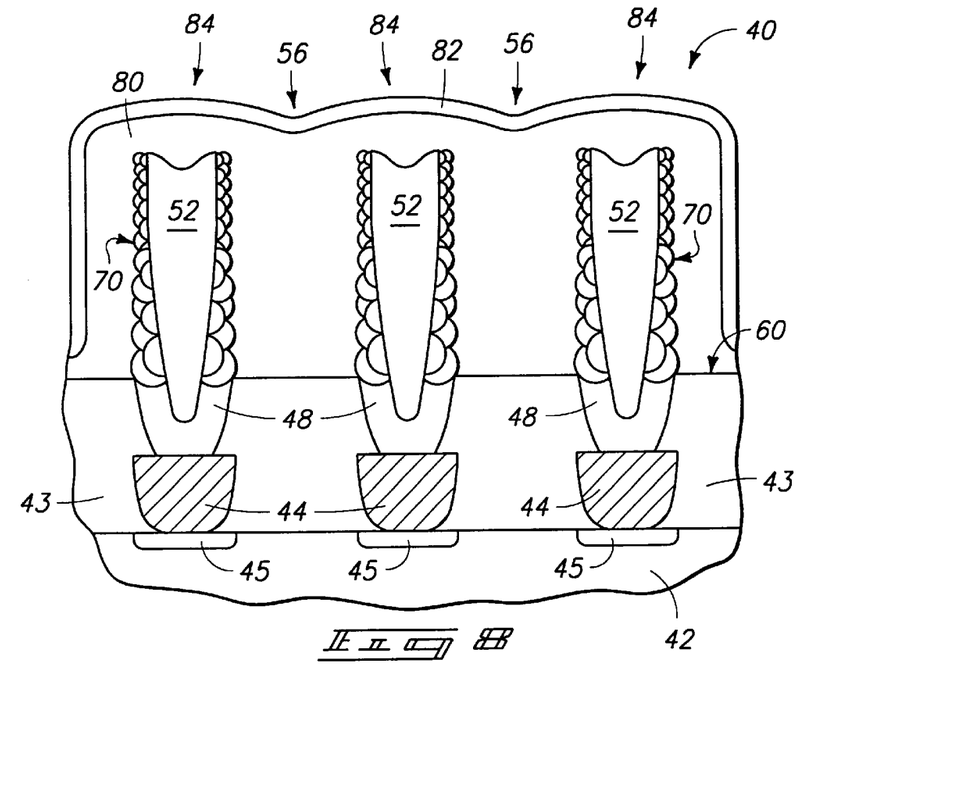
FIG. 8 is a view of the FIG. 2 substrate fragment shown at a processing step subsequent to that of FIG. 7.

Referring to FIG. 8, a dielectric layer 80 is formed over the doped polysilicon layer 52, HSG layer 70 and material 43 to fill recesses 56. Dielectric layer 80 can comprise, for example, one or more of silicon dioxide, silicon nitride, tantalum pentoxide (Ta$_2$O$_5$) or barium strontium titantate (BaSrTiO$_3$). An electrically conductive layer 82 is formed over dielectric layer 80 to define capacitor constructions 84. Electrically conductive layer 82 can comprise, for example, one or more of titanium nitride (TiN), tungsten nitride (WN), platinum (Pt), or polysilicon.

Another embodiment of the present invention is described with reference to FIGS. 9–13. Like numerals from the first described embodiment are employed where appropriate, with differences being indicated with the suffix (a) or different numerals.

Figure 9:
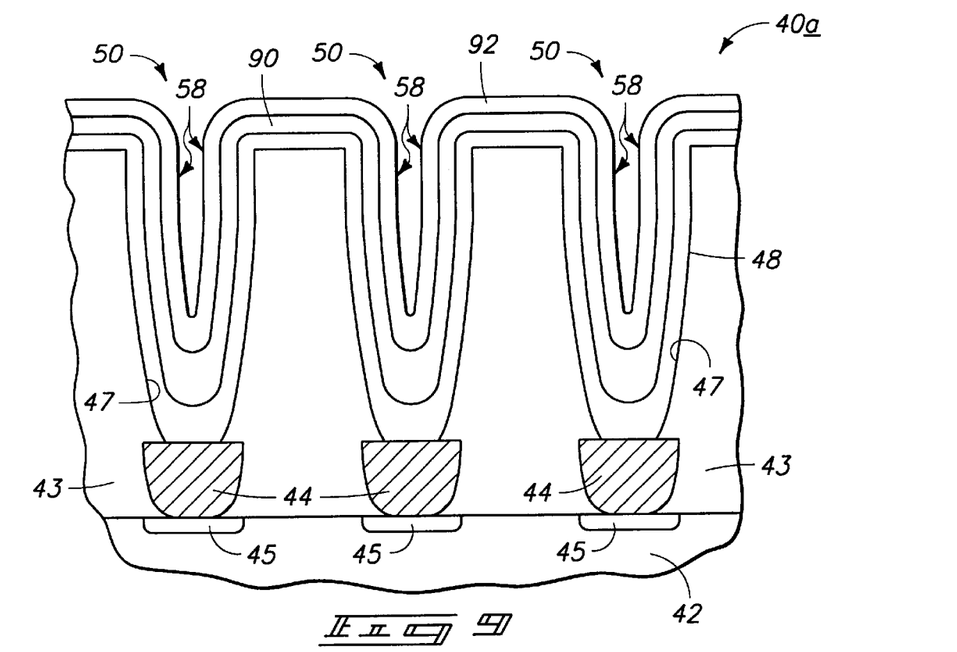
FIG. 9 is a fragmentary sectional view of a semiconductor substrate at a processing step in accordance with a second embodiment of the invention.

Referring to FIG. 9, a semiconductor substrate fragment in process is indicated generally with reference numeral 40a. Such is shown at a processing step subsequent to that of FIG. 2 and comprises a plurality of openings 46 with three layers 48, 90, 92 formed therein and over material 43. An exemplary material 43 comprises BPSG. In the shown embodiment, openings 46 are not completely filled, leaving voids 50 defined by inner walls 58. Layer 48 comprises a first layer of amorphous silicon, layer 90 comprises doped polysilicon, and layer 92 comprises a second layer of amorphous silicon. Each of layers 48, 90 and 92 can comprise a thickness of, for example, about 500 Angstroms.

Figure 10:
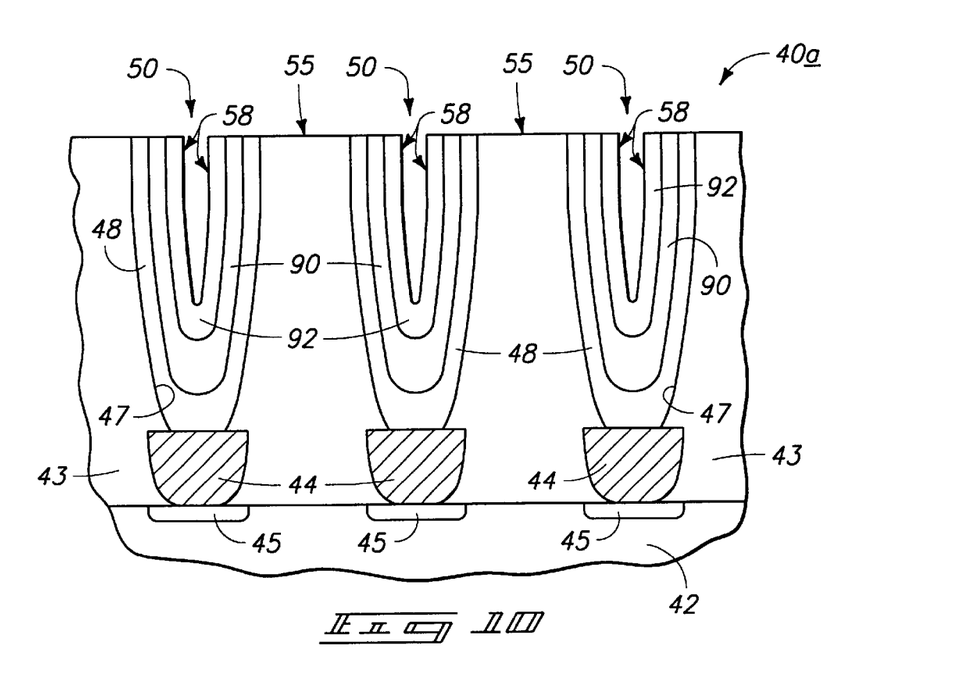
FIG. 10 is a view of the FIG. 9 substrate fragment shown at a processing step subsequent to that of FIG. 9.

Referring to FIG. 10, layers 48, 90 and 92 are planarized to form a first upper surface 55. An exemplary method for such planarization is chemical-mechanical polishing. The planarization can also remove some of material 43.

Figure 11:
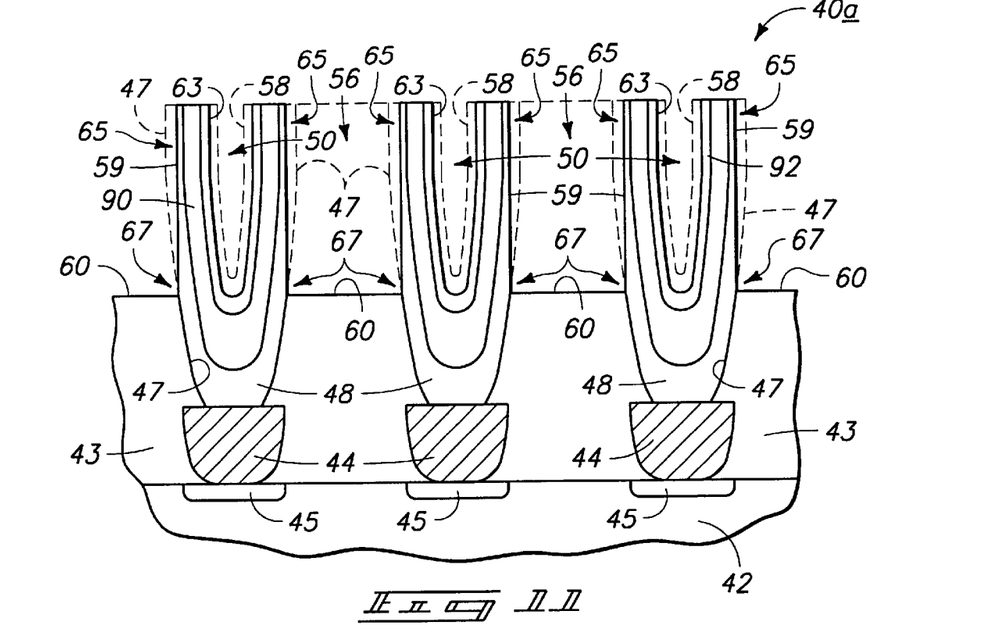
FIG. 11 is a view of the FIG. 9 substrate fragment shown at a processing step subsequent to that of FIG. 10.

Referring to FIG. 11, first upper surface 55 (FIG. 10) is exposed to etching conditions such that amorphous layers of silicon 48 are selectively etched relative to BPSG material 43. In one aspect of the invention, the etching conditions comprise, for example, a buffered oxide etch which etches amorphous silicon layer 48 at a slower rate than BPSG material 43. A suitable etch utilizes a solution comprising hydrofluoric acid (HF) (assay of 49 percent) diluted (buffered) with ammonium fluoride ($NH_4F$) and comprises exposure to such solution at 21° C. for approximately 25 minutes. Such etching conditions can etch amorphous silicon layer 48 at a removal rate of about 11 Angstroms per minute, and can etch BPSG material 43 at a removal rate of about 280 Angstroms per minute.

Etched material 43 defines recesses 56 and a second upper surface 60 elevationally below first upper surface 55. The tapered walls 47 of amorphous silicon layer 48 (shown in phantom) are etched back to form a wall 59 more vertical than walls 47. The etched amorphous silicon layer 48 has a gradient of thickness, and specifically is thinner at a first region 65 proximate upper surface 55 than at a second region 67 below the first region 65. An exemplary gradient progression would continuously increase between the smaller thickness and larger thickness. The dimensions of voids 50 are increased when second amorphous silicon layer 92 is etched back to form inner walls 63.

Figure 12:
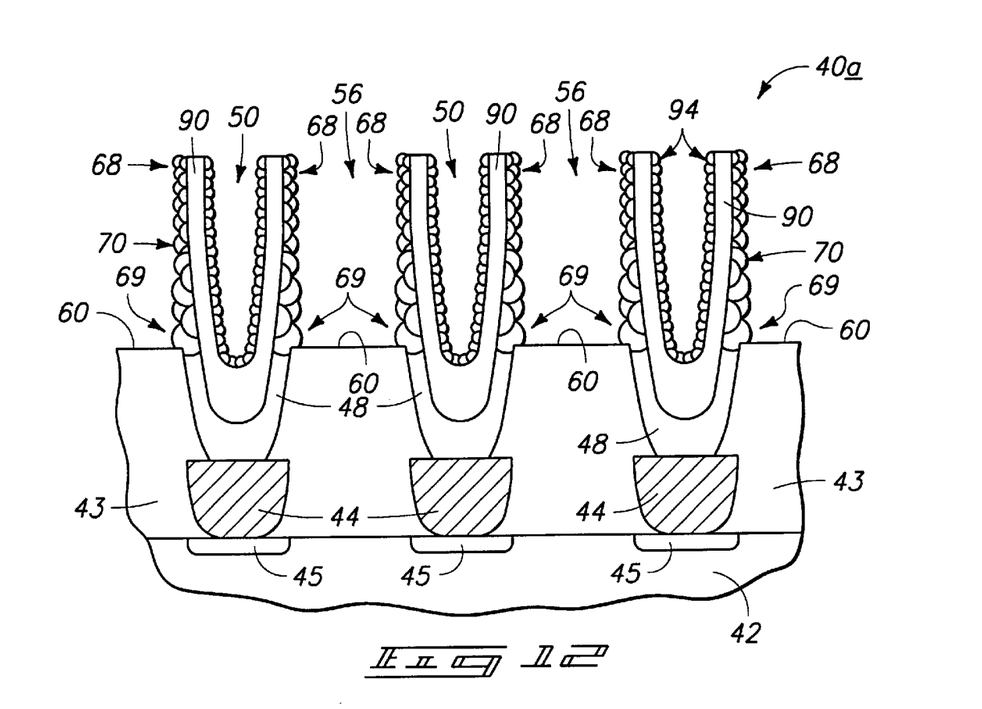
FIG. 12 is a view of the FIG. 9 substrate fragment shown at a processing step subsequent to that of FIG. 11.

Referring to FIG. 12, amorphous silicon layers 48 and 92 are converted into hemispherical grain polysilicon (HSG) layers 70 and 94, respectively, by, for example, placing substrate 42 in an Integral Pro machine under conditions to seed amorphous silicon layers 48 and 92 with disilane and then subject the same to annealing temperatures. Next, doped polysilicon layer 90 is subjected to conditions to out diffuse dopant from same into the HSG layers 70 and 94. The grain size of the HSG layer 70 varies from a smaller grain size at a first region 68 proximate upper surface 55, to a larger grain size at a second region 69 below the first region 68. An exemplary gradient progression would continuously increase between the smaller grain size to the larger grain size.

Figure 13:
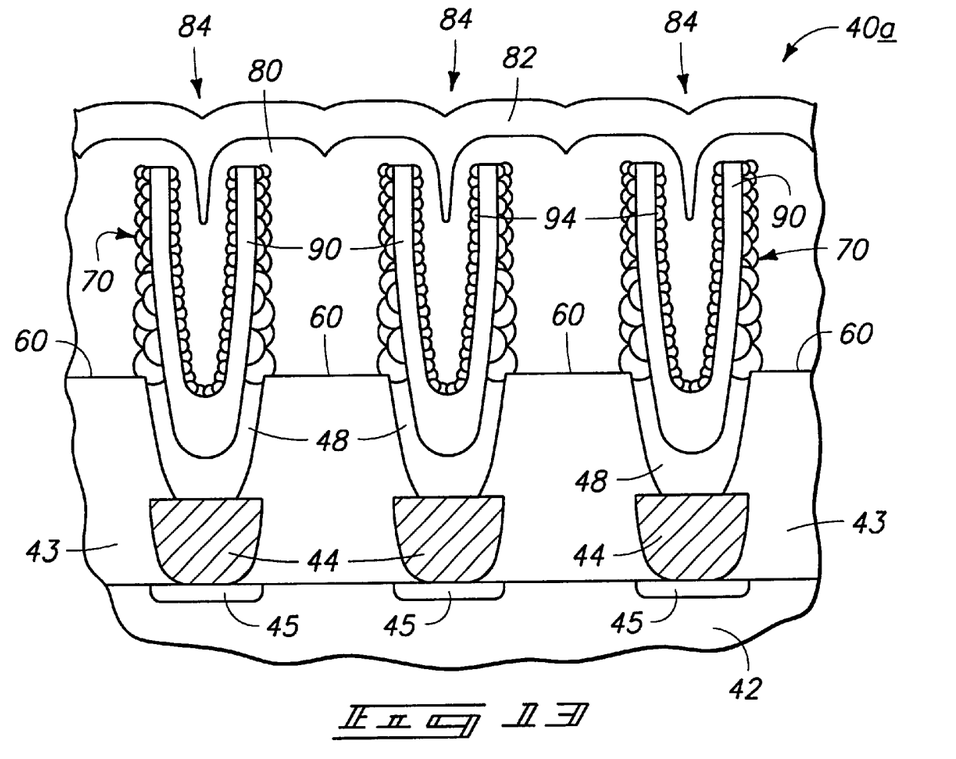
FIG. 13 is a view of the FIG. 9 substrate fragment shown at a processing step subsequent to that of FIG. 12.

Referring to FIG. 13, a dielectric layer 80 is formed over doped polysilicon layer 90, HSG layers 70 and 94 and material 43 to fill voids 50 and recesses 56. Dielectric layer 80 can comprise, for example, one or more of silicon dioxide, silicon nitride, tantalum pentoxide ($Ta_2O_5$) or barium strontium titantate ($BaSrTiO_3$). An electrically conductive layer 82 is formed over dielectric layer 80 to define capacitor constructions 84. Electrically conductive layer 82 can comprise, for example, one or more of titanium nitride (TiN), tungsten nitride (WN), platinum (Pt), or polysilicon.

While the shown embodiment deals with methods and processing to form capacitor structures, it should be understood that subject matter of the present application, for example, providing an amorphous layer of silicon having a gradient of thickness variation and transforming the amorphous layer of silicon into a hemispherical grain polysilicon layer having varying grain size therein, is applicable for methods and processes to construct conductive components and devices having small feature sizes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming hemispherical grain polysilicon layers, comprising:
   providing a first amorphous layer of silicon, the first amorphous layer of silicon having a gradient of thickness variation;
   providing a second amorphous layer of silicon over the first amorphous layer of silicon; and
   transforming the first and second amorphous layers of silicon into hemispherical grain polysilicon layers, and at least one hemispherical grain polysilicon layer having varying grain size therein.

2. The method of claim 1 wherein the hemispherical grain polysilicon layers are separated by an intervening layer comprising conductively doped polycrystalline silicon.

3. The method of claim 1 wherein the hemispherical grain polysilicon layers comprise a thickness of about 500 Angstroms.

4. The method of claim 1 further comprising:
   forming a doped polysilicon layer between the hemispherical grain polysilicon layers; and
   subjecting the doped polysilicon layer to conditions which out-diffuse at least one dopant from the doped polysilicon layer into the hemispherical grain polysilicon layers.

5. A semiconductor processing method of forming hemispherical grain polysilicon layers, comprising:
   providing a first amorphous layer of silicon;
   providing a second amorphous layer of silicon over the first amorphous layer of silicon; and
   transforming the first and second amorphous layers of silicon into hemispherical grain polysilicon layers, and at least one hemispherical grain polysilicon layer having a gradient of varying grain size therein.

6. The method of claim 5 wherein the hemispherical grain polysilicon layers are separated by an intervening layer comprising conductively doped polycrystalline silicon.

7. The method of claim 5 further comprising:
   forming a doped polysilicon layer between the hemispherical grain polysilicon layers; and
   subjecting the doped polysilicon layer to conditions which out-diffuse at least one dopant from the doped polysilicon layer into the hemispherical grain polysilicon layers.

8. A semiconductor processing method of forming hemispherical grain polysilicon layers, comprising:

forming at least one opening in a material;

forming a plurality of hemispherical grain polysilicon layers within the at least one opening, the hemispherical grain polysilicon layers extending from a lower portion of the at least one opening to an upper portion, and at least one of the hemispherical grain polysilicon layers having a grain size which increases at the lower portion of the at least one opening relative to a grain size of the at least one of the hemispherical grain polysilicon layers at the upper portion of the at least one opening.

9. The method of claim 8 wherein forming the plurality of hemispherical grain polysilicon layers comprises transforming amorphous layers of silicon into hemispherical grain polysilicon layers, and wherein at least one amorphous layer of silicon comprises a thickness which is greater at the lower portion of the at least one opening than at the upper portion of the at least one opening.

10. The method of claim 8 wherein the material defines the at least one opening having inwardly sloped walls.

11. A method of forming an electrically conductive electrode layer comprising forming a plurality of electrically conductive hemispherical grain polysilicon layers in electrical communication with each other, and at least one of the hemispherical grain polysilicon layers having a gradient of varying grain size therein.

12. The method of claim 11 further comprising:

forming a doped polysilicon layer between the hemispherical grain polysilicon layers; and subjecting the doped polysilicon layer to conditions which out-diffuse at least one dopant from the doped polysilicon layer into the hemispherical grain polysilicon layers.

13. A method of forming one or more capacitors comprising:

forming a first electrically conductive electrode layer, the first electrode layer comprising a plurality of electrically conductive hemispherical grain polysilicon layers in electrical communication with each other, and at least one of the hemispherical grain polysilicon layers having a gradient of varying grain size therein;

forming an electrically insulative layer over the first electrode layer; and forming a second electrically conductive electrode layer over the electrically insulative layer.

14. The method of claim 13 wherein forming the first electrode layer comprises transforming amorphous layers of silicon into hemispherical grain polysilicon layers.

15. The method of claim 13 further comprising:

forming a plurality of amorphous layers of silicon;

removing portions of at least one of the amorphous layers of silicon to alter a thickness of at least a portion of the at least one amorphous layer of silicon; and transforming the plurality of amorphous layers into hemispherical grain polysilicon layers.

16. The method of claim 15 wherein the removing portions comprises etching.

* * * * *